United States Patent

Snyder, Jr.

[11] Patent Number: 5,841,796
[45] Date of Patent: Nov. 24, 1998

[54] APPARATUS AND METHOD FOR CALCULATING VITERBI PATH METRIC USING EXPONENTIALLY-WEIGHTED MOVING AVERAGE

[75] Inventor: John S. Snyder, Jr., Frederick, Md.

[73] Assignee: Comsat Corporation, Bethesda, Md.

[21] Appl. No.: 404,653

[22] Filed: Mar. 14, 1995

[51] Int. Cl.$^6$ ............................................. H03M 13/12
[52] U.S. Cl. .................... 371/43.6; 371/43.7; 375/265; 375/341
[58] Field of Search ................. 371/43, 43.6, 43.7; 375/341, 265

[56] References Cited

U.S. PATENT DOCUMENTS

| | | | |
|---|---|---|---|
| 4,015,238 | 3/1977 | Davis | 371/43 |
| 4,500,994 | 2/1985 | McAllister et al. | 371/43 |
| 4,713,817 | 12/1987 | Wei | 371/43 |
| 4,748,626 | 5/1988 | Wong | 371/30 |
| 4,761,784 | 8/1988 | Srinivassagopalan et al. | 371/43 |
| 4,847,871 | 7/1989 | Matsushita et al. | 375/341 |
| 4,888,775 | 12/1989 | Karabed et al. | 371/43 |
| 4,979,175 | 12/1990 | Porter | 371/43 |
| 5,027,374 | 6/1991 | Rossman | 375/341 |
| 5,050,191 | 9/1991 | No | 375/341 |
| 5,081,651 | 1/1992 | Kubo | 375/341 |
| 5,185,747 | 2/1993 | Farahati | 371/43 |
| 5,193,094 | 3/1993 | Viterbi | 371/43 |
| 5,220,570 | 6/1993 | Lou et al. | 371/43 |
| 5,255,127 | 10/1993 | Nakatsu et al. | 360/29 |
| 5,265,127 | 11/1993 | Betts et al. | 375/265 |
| 5,396,519 | 3/1995 | Betts et al. | 375/296 |
| 5,418,795 | 5/1995 | Itakura et al. | 371/30 |
| 5,481,572 | 1/1996 | Skold et al. | 375/347 |
| 5,548,684 | 8/1996 | Wang et al. | 395/21 |

OTHER PUBLICATIONS

Millman et al., "Microelectronics", 2nd ed., McGraw–Hill, pub., copyright 1987, pp. 291–304, Dec. 1987.

*Primary Examiner*—Stephen M. Baker
*Attorney, Agent, or Firm*—Sughrue, Mion, Zinn, Macpeak & Seas, PLLC

[57] ABSTRACT

A path metric used in Viterbi decoding can be calculated by adding a slightly attenuated value of a previously calculated path metric to a current branch metric value. The attenuation of the previous path metric may be implemented by multiplying the previous path metric by a constant, where the constant is typically greater than 0.9 and is less than 1. Thus, the maximum path metric value is inherently bounded and is an exponentially-weighted approximation of a moving average of selected previous branch metrics. This eliminates the need for a normalization function to prevent overflow and simplifies the hardware necessary for calculating the path metric.

23 Claims, 7 Drawing Sheets

APPARATUS AND METHOD FOR CALCULATING VITERBI PATH METRIC USING EXPONENTIALLY-WEIGHTED MOVING AVERAGE

BACKGROUND OF THE INVENTION

The present invention relates to calculating a path metric used in a maximum likelihood decoding operation, e.g., Viterbi decoding.

In a typical system in which the present invention may be used, a convolutional encoder translates each data bit into a number of symbols which are then transmitted. In doing this, the encoder will transition through a number of encoder states. At the receiving end, a maximum likelihood decoder, such as a Viterbi decoder, then recreates the data by decoding the symbols, trying to recreate the sequence of encoder states. For each encoder state, there is a sequence of prior encoder states and data bits that could have led to that encoder state. The decoder keeps track of several possible sequences of bits, and the corresponding encoder states that would have resulted, and selects one sequence of encoder states as the most likely given what the decoder has detected. The various states of the encoder can be represented as a trellis diagram (such as shown in FIG. 1) representing a sequence of transitions between a finite number of encoder states and the symbols that will cause a transition from one state to the next. A sequence of encoder states is then referred to as a "path" through the trellis diagram.

In a conventional Viterbi decoder, a quantity known as the path metric is calculated for possible paths through a trellis diagram. The path metric of a particular valid path is dependent upon the degree of "fit" or similarity between a received encoded data sequence and the data sequence represented by that path.

A value called a branch metric is assigned to each branch of the trellis. In FIG. 1, for example, each of the branches $t_1$ and $t_2$ leading out of state A at time $k_1$ have an assigned branch metric which is dependent upon the degree of "fit" or similarity between received data and the data represented by branches $t_1$ and $t_2$, respectively. A path metric is actually the sum of all branch metrics for a given path up to a certain point in time.

The path metric at time $k_2$ at state A can be calculated by adding the branch metric associated with branch $t_1$ to the path metric at state A calculated at time $k_1$. Assuming operation began at time $k_1$, the path metric at time $k_2$ would be equal to the branch metric associated with branch $t_1$ (since the path metric at time $k_1$ would be equal to zero). Similarly, the path metric at state B at time $k_2$ is equal to the branch metric associated with branch $t_2$ plus the path metric at state A calculated at time $k_1$ (assuming operation began at time $k_1$, the path metric at state B at time $k_2$ is equal to the branch metric associated with branch $t_2$).

At time $k_3$, two path metrics are calculated for each state. The first path metric calculated at state A at time $k_3$ is equal to the path metric calculated at state A at time $k_2$ plus the branch metric associated with branch $t_3$ shown in FIG. 1. Similarly, the second path metric at state A at time $k_3$ is calculated by adding the branch metric associated with branch $t_5$ to the path metric calculated at state B at time $k_2$. In Viterbi decoding, only the path metric which has the greatest likelihood of corresponding to the transmitted encoded data is used as the path metric at a given time for a given state. Depending on the value of the two calculated path metrics at state A at time $k_3$, the one with the greatest likelihood of corresponding to the transmitted encoded data is called the survivor and is used as the path metric at state A at time $k_3$. The one with the least likelihood of corresponding to the transmitted encoded data is discarded.

Similarly, two path metrics are calculated at time $k_3$ at state B. The first path metric is calculated by adding the branch metric associated with branch $t_4$ to the path metric calculated at state A at time $k_2$. The second path metric is calculated by adding the branch metric associated with branch $t_6$ to the path metric calculated at state B at time $k_2$. The one of these two path metrics at state B at time $k_3$ which has the greatest likelihood of corresponding to the transmitted encoded data is the survivor and is used as the path metric at state B at time $k_3$, while the other of these two is discarded and not used. The path metrics at states A and B at time $k_4$ and at state A at time $k_5$ are calculated in a similar manner. Thus, the path with the highest likelihood of corresponding to the encoded data sequence generated by the encoder is used to generate the decoded data sequence.

The conventional path metric calculating method described above is the one most commonly used in Viterbi decoding. However, since this method results in a path metric quantity which can increase without bound, overflow can occur. To prevent overflow, a normalizing value may be subtracted from the addition of the previous path metric and the current branch metric. This results in a path metric calculation using the formula:

$$M_p(n)=M_p(n-1)+M_b(n)-f_{norm}(n),$$

where $f_{norm}(n)$ is the current value of a normalizing function.

Ideally, the normalizing value is calculated using the largest and/or smallest metrics depending upon the metric assignment scheme used. A practical compromise for high-speed applications is to employ the difference between an arbitrarily chosen state metric and a value near mid-range.

Not only must the normalizing function be calculated using this method, but a subtraction operation must be included in all path metric computations to subtract the normalizing function. This has a significant hardware impact on highly-parallel, medium- and high-speed implementations.

Alternatively, the value of the normalizing function may be subtracted from the branch metric value before calculating the path metric. Since the number of branch metrics is typically much less than the number of path metrics, this approach is particularly appealing in highly parallel applications. However, injecting the normalizing operation one stage before the path metric computation usually produces a two-step delay in the complete normalization feedback loop. This additional delay results in an unstable feedback system. In order to stabilize the loop, the state metric value used in the normalization function must be reduced to a suitable value.

SUMMARY OF THE INVENTION

An object of the present invention is to calculate a path metric used in maximum likelihood decoding which is inherently bounded while eliminating the need for a normalizing function. By eliminating the need for a normalizing function, the path metric and/or branch metric computation may be simplified and the above-mentioned stability problems may be eliminated.

According to the present invention, a path metric is calculated by adding a current branch metric value to a slightly attenuated value of a previous path metric. This path metric can be expressed using the following formula:

$$M_p(n)=kM_p(n-1)+M_b(n),$$

where $M_p(n)$ is a current path metric, $M_p(n-1)$ is a previous path metric, $M_b(n)$ is a current branch metric, and k is a constant. The value of the constant k is preferably less than 1 and greater than 0.9. The path metric for the best path entering a particular state is selected as the new path metric for that state in the same manner as in conventional maximum likelihood decoding as described above.

BRIEF DESCRIPTION OF THE DRAWINGS

Other features and advantages of the present invention will be apparent from the following description taken in connection with the accompanying drawings, wherein.

DESCRIPTION OF THE PREFERRED EMBODIMENTS

A path metric calculated in the conventional manner as described in the Background of the Invention section herein, contains memory of previous values extending back to the beginning of the message. However, path data (i.e., the path length) is only stored for four or five constraint lengths. This path length value has generally been found to provide negligible degradation in performance.

Since a satisfactory output decision can be made after four or five constraint lengths, there appears to be no need to maintain a longer path metric memory. Truncating the conventional path metric to a length L which is equal to the path memory is essentially equivalent to calculating the current value of a particular path metric as an ideal, equally-weighted moving average of the previous L branch metrics for that path. Unfortunately, an ideal moving average which is equally-weighted offers little practical usefulness for metric computation.

A simple recursive structure with a feedback factor of k, which is less than 1, provides an approximation of an ideal moving average in which previous input values are weighted in an exponentially-decaying manner. Applying this concept of an exponentially weighted moving average to the computation of a path metric results in the following equation:

$$M_p(n)=kM_p(n-1)+M_b(n),$$

where $M_p(n)$ is a current path metric, $M_p(n-1)$ is a previous path metric, $M_b(n)$ is a current branch metric, and k is a constant which is less than 1.

Figure 2:
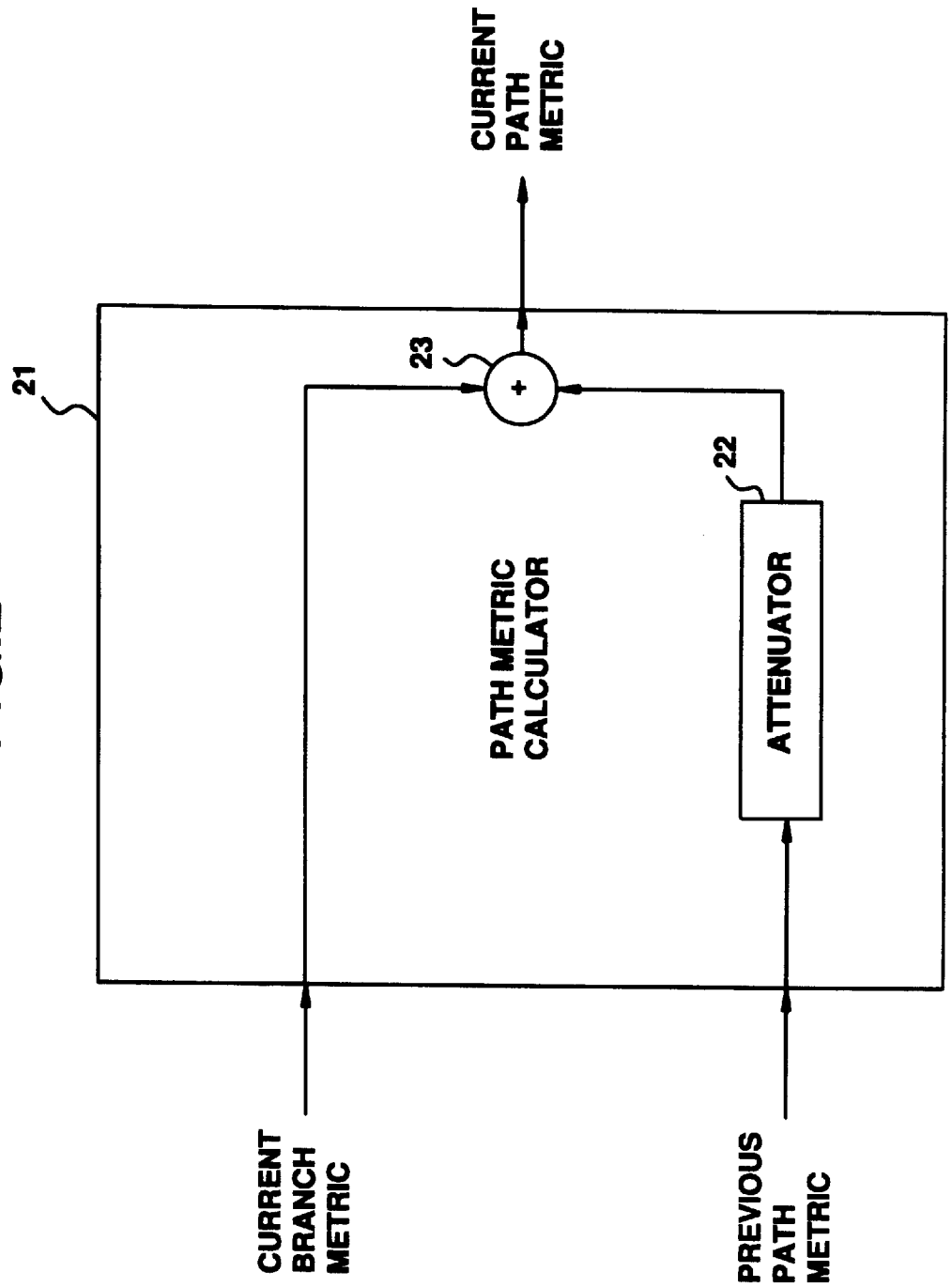
FIG. 2 is a block diagram showing a path metric calculator according to a first embodiment of the present invention.

FIG. 2 shows a path metric calculator 21 according to a first embodiment of the present invention. The current path metric is calculated by adding a current branch metric value to a slightly attenuated value of a previous path metric. Attenuator 22 is used to attenuate the previous path metric value. This attenuation may be implemented by multiplying the previous path metric value by a constant (weighting parameter) where the constant is less than 1 and is typically greater than 0.9. Adder 23 adds the attenuated previous path metric value to the current branch metric value to provide the current path metric as an output of the path metric calculator 21. Thus, a path metric calculated according to the present invention is calculated according to the equation set forth above. That is:

$$M_p(n)=kM_p(n-1)+M_b(n).$$

Once the path metric calculator 21 has been used to calculate the path metric for each path in a trellis entering one of the possible encoder states, the metric for the most likely path entering that state is selected as the new path metric for that state in the same manner as in conventional Viterbi decoding.

This means of calculating the path metric (i.e., attenuating the previous path metric by multiplying it by a constant k, wherein 0.9<k<1.0) describes a recursive structure in which previous branch metric values are weighted as sequential powers of k. Since k is less than 1, the weight of more distant past branch metric values decays exponentially. Therefore, this calculated path metric is an exponentially-weighted approximation of a moving average of selected previous branch metrics.

Unlike the conventionally calculated Viterbi path metric, the maximum value of the path metric calculated according to the present invention is inherently bounded. Thus, a mechanism used to prevent overflow (such as the conventional normalizing function) is not necessary. The maximum path metric value when using the exponentially-weighted moving average method of path metric calculation according to the present invention is equal to the maximum branch metric value divided by (1−k). That is:

$$\text{Max}M_p = \frac{\text{Max}M_b}{(1-k)}$$

In order to minimize the number of bits required to express each path metric, it is necessary to minimize the value of k. Moreover, a smaller value of k corresponds to a shorter averaging interval which improves transient response. On the other hand, k must be large enough so that a satisfactory approximation to the ideal moving average metric is achieved such that performance degradation is minimized. Using a rate ½ convolutional code of constraint length five, computer simulations using a decoder path length of L=32 showed no more than 0.1 dB degradation in bit-error-rate performance for a value of k=0.96875 (i.e., 31⁄32) as compared with a conventional path metric calculation.

Figure 3:
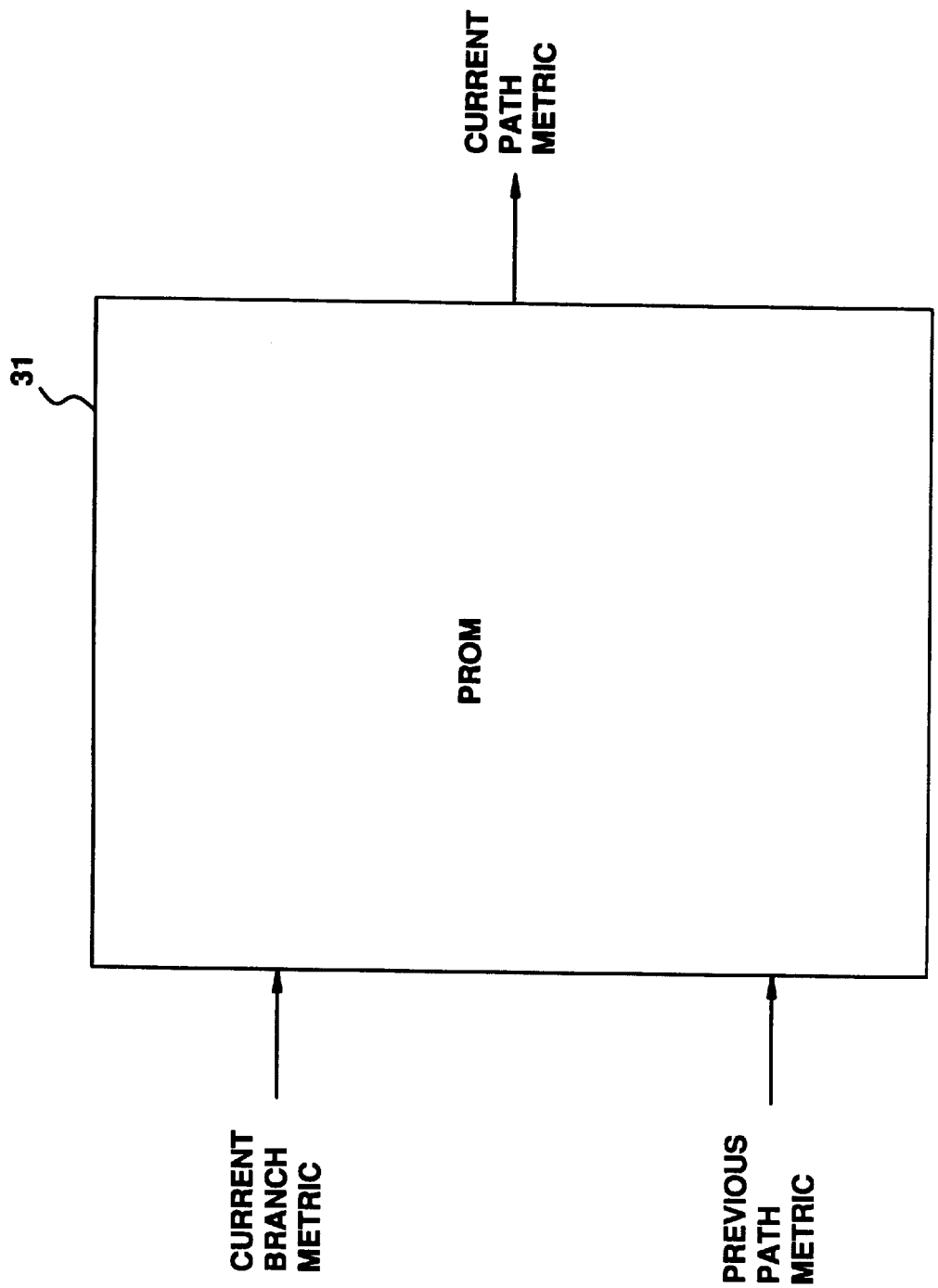
FIG. 3 is a block diagram showing a programmable read-only memory (PROM) used to calculate a path metric according to the first embodiment of the present invention.

Alternatively, the hardware used to calculate the path metric in FIG. 2 may be substituted by a programmable device. As shown in FIG. 3, a single programmable read-only memory (PROM 31) may be used to calculate the path metric according to the first embodiment of the present invention.

PROM 31 is programmed to compute the current path metric using a current branch metric, a previous path metric and a constant according to the equation set forth in the description of FIG. 2. Thus, the computation of the exponentially-weighted moving average path metric is readily accomplished using a single PROM 31, since the computation may be viewed as a code conversion in which an input branch metric and an input previous path metric are mapped to a current path metric value. Thus, the operations of attenuation of the previous path metric by the constant k and addition of the current branch metric value may be performed as a single operation.

Although a programmable read-only memory (PROM 31) has been shown in FIG. 3 to calculate the path metric, any type of read-only memory could be used to practice the first embodiment of the present invention.

Figure 1:
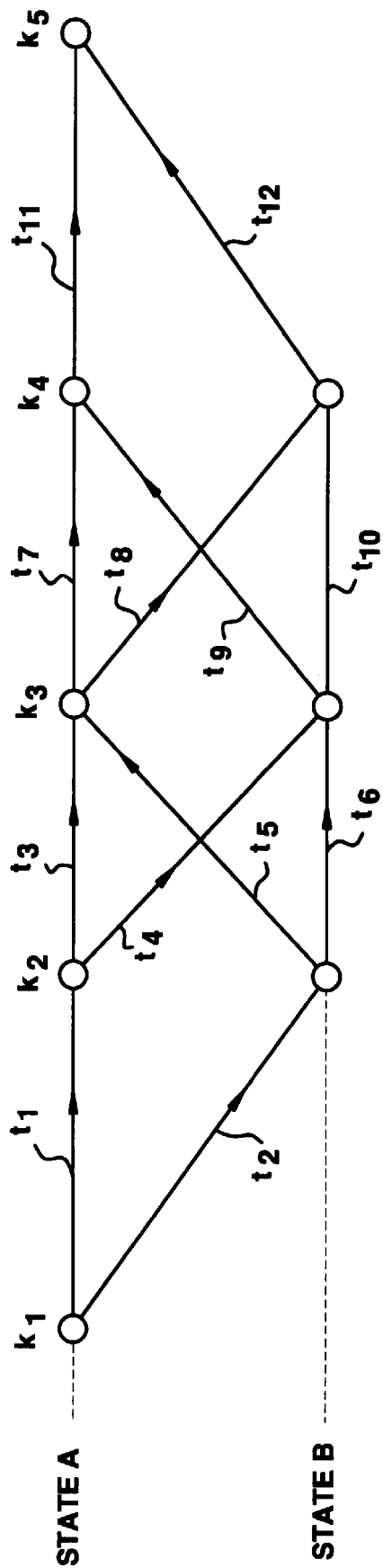
FIG. 1 is a trellis diagram representing a sequence of transitions between two finite states used for purposes of describing a Viterbi decoding operation.
Figure 4:
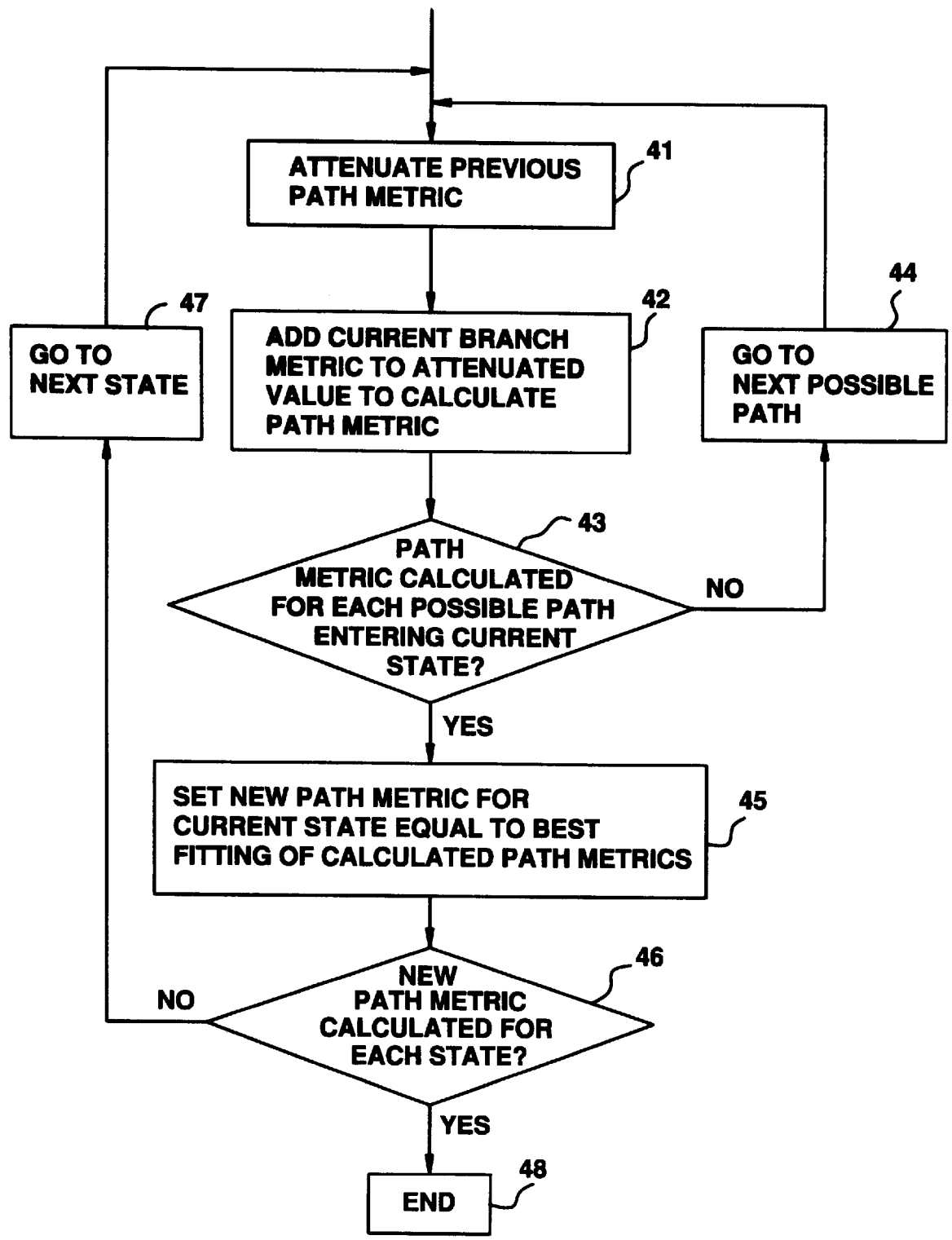
FIG. 4 is a flow chart used to program a programmable device (such as PROM 31 shown in FIG. 3) to calculate path metrics at a given time for a plurality of states used in encoding signals decoded by a Viterbi decoder according to the first embodiment of the present invention.

FIG. 4 shows a flow chart which may be used to program a device to calculate new path metrics at a particular time for each possible encoder state. For example, the flow chart of FIG. 4 will be described to calculate the new path metrics for state A and state B at time $k_3$ (see FIG. 1).

Starting with state A at time $k_3$, the path metric value at state A at time $k_2$ is attenuated by constant k at step 41 of FIG. 4. In step 42, the branch metric value associated with branch $t_3$ is added to the value attenuated in step 41 to calculate the path metric entering state A at time $k_3$ through branch $t_3$. Step 43 of FIG. 4 then determines whether or not the path metric for each possible path entering state A at time $k_3$ has been calculated. In this case, another possible path entering state A has not been calculated (i.e., the path entering state A at time $k_3$ via branch $t_5$). Step 44 indicates that steps 41–43 will now be repeated for this other path.

Now the path metric at state B at time $k_2$ is attenuated by constant k in step 41. Then, the branch metric associated with branch $t_5$ is added to this attenuated value in step 42 to provide a second calculated path metric value. Step 43 then determines that the path metric has been calculated for each of the possible paths entering state A at time $k_3$. Therefore, control goes to step 45. In step 45, the path metric of the best fitting path entering state A at time $k_3$ (i.e., the path entering state A having the greatest degree of similarity between the encoded data sequence and the data sequence represented by that path) is set as the new path metric for state A and the other path metric is discarded.

Step 46 determines that the new path metric has not yet been calculated for each state. Therefore, control goes to step 47 and the above process of calculating the new path metric is then repeated for state B.

According to the second embodiment of the present invention, the calculation of the branch metric value may be included in the path metric calculation. The branch metric calculation is also a simple code conversion which, in many practical cases, may be expressed using the formula:

$$M_b(n)=K_I I(n)+K_Q Q(n),$$

where $K_I$ and $K_Q$ are constants which depend on the type of modulation used and $I(n)$ and $Q(n)$ are soft-detected data symbols corresponding to the nth code symbol received by the decoder.

Values of $K_I$ and $K_Q$ of $\pm 1$ can be used for BPSK and QPSK modulation. Using a rate ½ code, $I(n)$ and $Q(n)$ are the two received data symbols resulting from a single information bit. For other modulation forms, $K_I$ and $K_Q$ are determined from the geometry of the modulation constellation. Where a single such modulation symbol corresponds exactly to a complete code symbol, $I(n)$ and $Q(n)$ are the soft-detected quadrature components of the received modulation symbol. The generalization to codes for which one complete code symbol extends over more than one modulation symbol is conceptually straightforward.

Thus, a path metric calculation in which the branch metric calculation is included, can be expressed using the following formula:

$$M_p(n)=kM_p(n-1)+K_I I(n)+K_Q Q(n).$$

Figure 5:
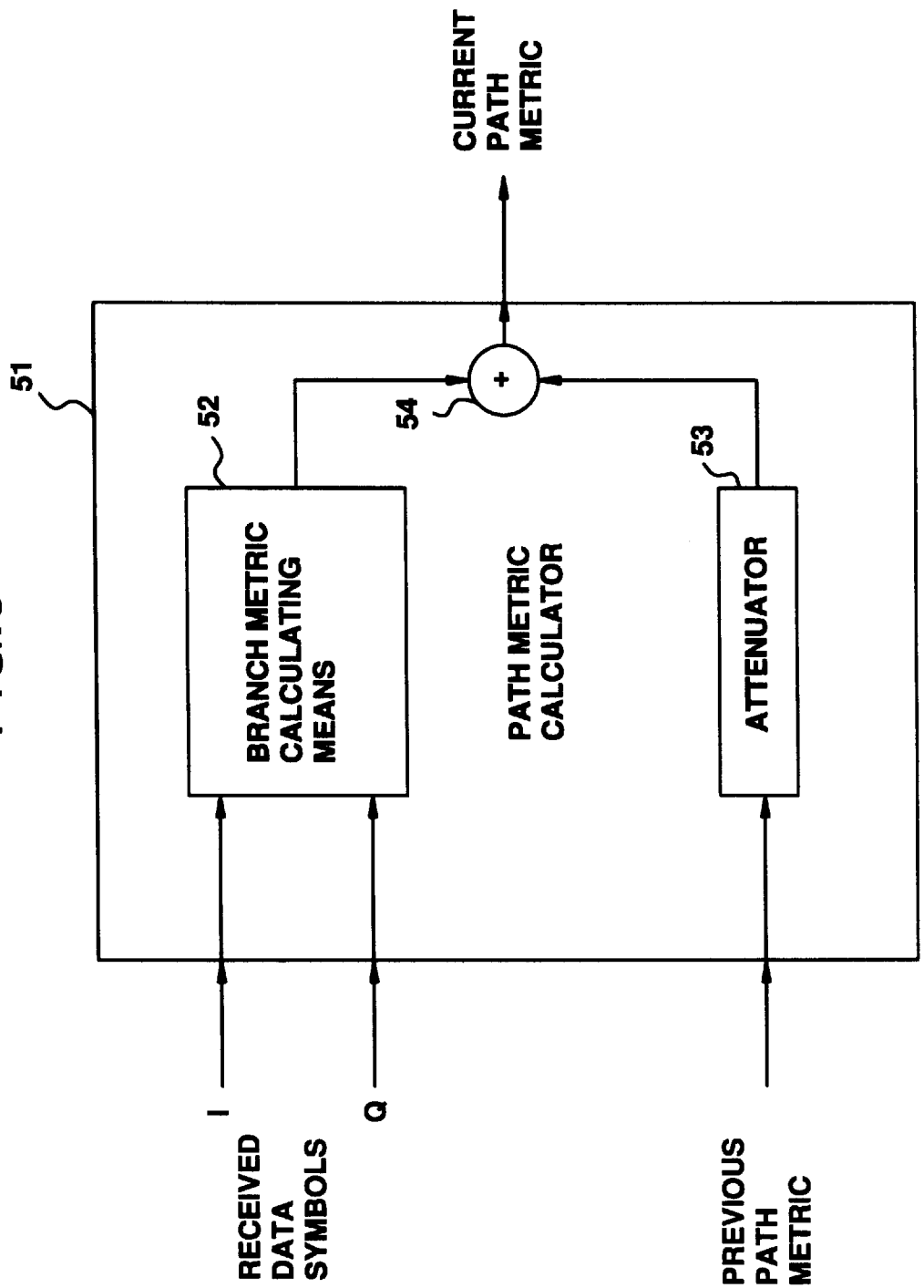
FIG. 5 is a block diagram showing a path metric calculator according to a second embodiment of the present invention.

FIG. 5 shows a path metric calculator 51 according to the second embodiment of the present invention. Branch metric calculating means 52 is used to calculate the current branch metric. The received data symbols $I(n)$ and $Q(n)$ are received as inputs to the branch metric calculating means 52. These values are multiplied by $K_I$ and $K_Q$, respectively, as described above. The results of these multiplications are added together and the added result is provided to adder 54 as an output of the branch metric calculating means 52 as the current branch metric.

Attenuator 53 is used to attenuate the previous path metric value. Attenuator 53 operates substantially the same as attenuator 22 shown in FIG. 2. Adder 54 adds the attenuated output value of attenuator 53 to the current branch metric received from branch metric calculating means 52. The output of adder 54 is provided as the current path metric value.

Once the path metric calculator 51 has been used to calculate the path metric for each path entering one of the states, the metric for the most likely path entering that state is selected as the new path metric for that state in the same manner as in conventional Viterbi decoding and as in the first embodiment of the present invention.

The second embodiment has the same benefits and features as the first embodiment. In addition, the current branch metric calculation may be included in the path metric calculation.

Figure 6:
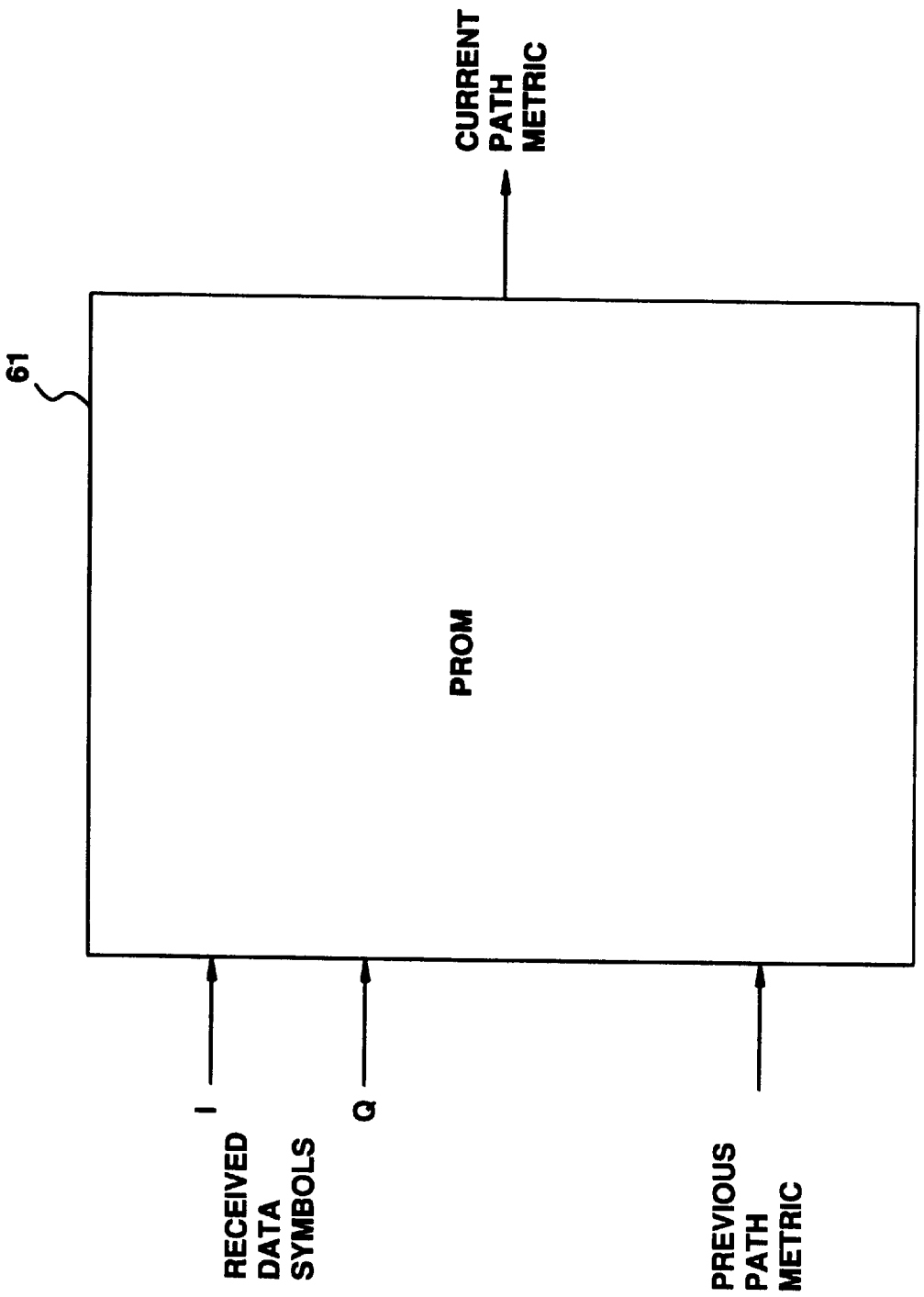
FIG. 6 is a block diagram showing a PROM used to calculate a path metric according to the second embodiment of the present invention.

Alternatively, the hardware used to calculate the path metric in FIG. 5 may be substituted by a programmable device. As shown in FIG. 6, a single PROM 61 may be used to calculate the path metric according to the second embodiment of the present invention.

PROM 61 is coded for the single value of $K_I$ and single value of $K_Q$ corresponding to the specific path metric being calculated. It is programmed to compute the current path metric using the received data symbols, the constants $K_I$ and $K_Q$, the previous path metric, and constant k, according to the equation set forth above. Thus, the computing of the current branch metric and the exponentially-weighted path metric is readily accomplished using a single PROM 61, since the computation may be viewed as a code conversion in which input received data symbols and an input previous path metric are mapped to a current path metric value. Thus, the operations of computing the current branch metric, attenuating the previous path metric, and adding these values together may be performed as a single operation.

The practical limitations on combining branch metric and path metric computations are determined by the number of bits necessary in expressing the PROM input and output quantities and by current PROM technology. I and Q bit size are determined by the desired input quantization while path metric, and therefore new path metric (i.e., state metric), size is determined by the maximum path metric equation set forth above. I.e.:

$$\mathrm{Max}M_p = \frac{\mathrm{Max}M_b}{(1-k)}.$$

The number of available PROM input pins is that required to address the PROM storage capacity, while the number of available output pins is governed by the organization of the PROM.

Although a programmable read-only memory (PROM 61) has been shown in FIG. 6 to calculate the path metric, any type of read-only memory could be used to practice the second embodiment of the present invention.

Figure 7:
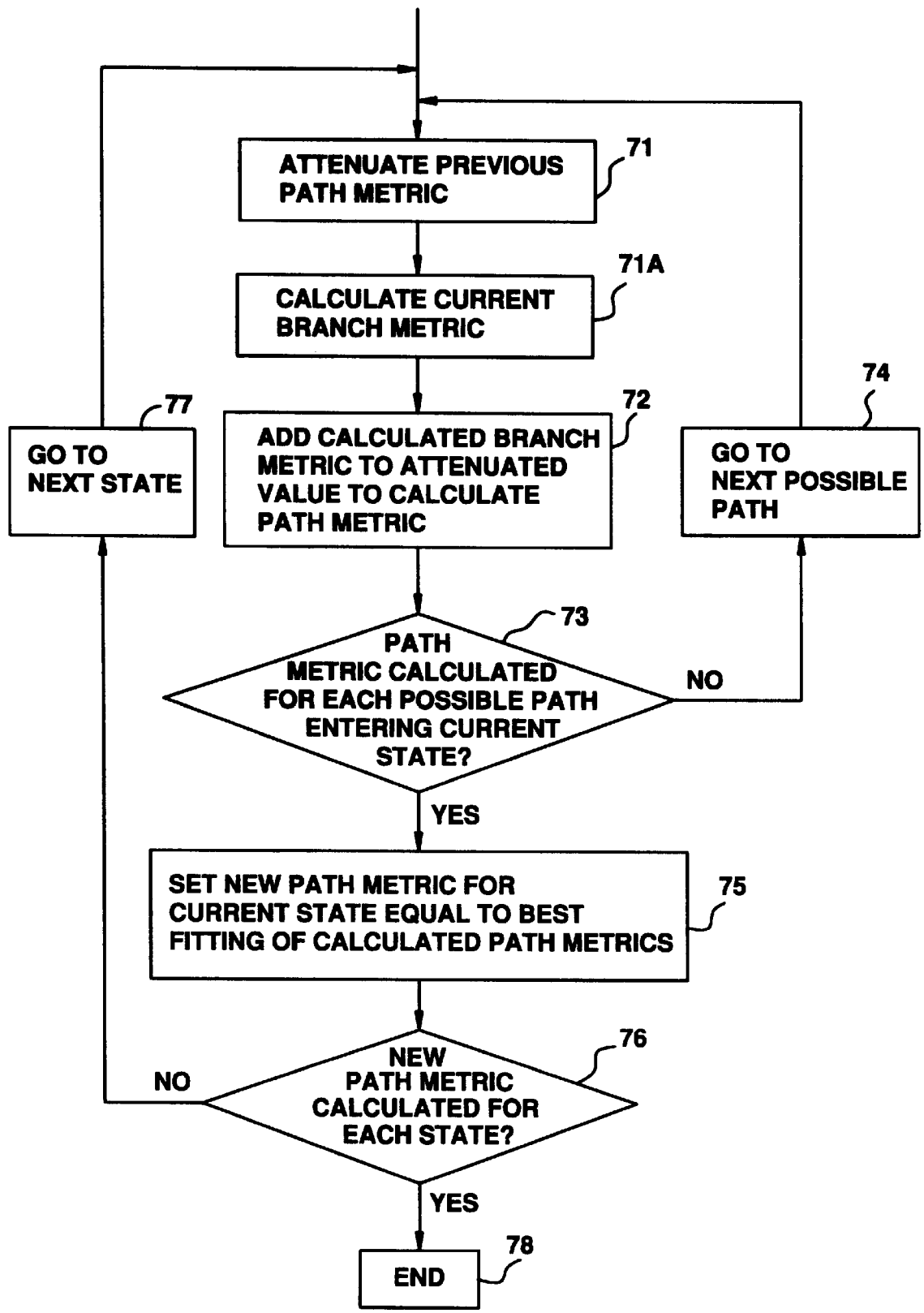
FIG. 7 is a flow chart used to program a programmable device (such as PROM 61 shown in FIG. 6) to calculate path metrics at a given time for a plurality of states used in encoding signals decoded by a Viterbi decoder according to the second embodiment of the present invention.

FIG. 7 shows a flow chart which may be used to calculate new path metrics at a particular time for each state used in encoding signals decoded using a Viterbi decoder. The flow chart of FIG. 7 is substantially the same as that of FIG. 4. Steps 73–78 correspond to steps 43–48 of FIG. 4. Since these steps have been described with reference to FIG. 4, such explanation will not be repeated here. The only difference in these two flow charts is the manner that each path metric is calculated in steps 71, 71A and 72. The previous path metric is attenuated in step 71 of FIG. 7 in the same manner as step 41 in FIG. 4. In step 71A, the branch metric is calculated according to the formula set forth above. That is, the branch metric may be calculated by multiplying received data symbols with constants which depend on the type of modulation used to encode the data and by adding the results of these multiplications.

In step 72, the resultant current branch metric calculated in step 71A is added to the attenuated value calculated in step 71. Thus, the FIG. 7 flow chart is the same as the FIG. 4 flow chart except that steps 71, 71A and 72 have been substituted for steps 41 and 42 in FIG. 4.

The exponentially-weighted moving average metric calculation of the present invention has many advantages over the conventional method. First, the present invention eliminates the need for a normalization function to prevent metric overflow. This elimination achieves a hardware reduction and avoids stability issues which are present using conventional feedback schemes used for normalization. Additionally, the Viterbi decoder Add/Compare/Select (ACS) function can be simplified, since the path metric may be computed using a single PROM.

Furthermore, the need to calculate the current branch metric separately can be eliminated. Conceptually, the branch metric calculation may be combined within the path metric PROM. However, as discussed above, the practical limitation is the number of available PROM inputs, which is directly related to the storage capacity of the PROM. Lastly, the path metric calculation may be implemented using simpler and more desirable technology (e.g., TTL instead of ECL). This is possible, in some cases, due to the simplification of the ACS function.

Not only does use of the exponential moving average eliminate the normalization function calculation and its attendant stability problems, but it also simplifies the branch metric and path metric calculations. This simplification consists first of eliminating the operation of subtracting the normalizing function, which is necessary using the conventional path metric calculating method, from either the path metric or branch metric calculation process. Secondly, the branch and path metric computations may be merged within a single PROM. Since one or more binary adders are typically required for each addition and each subtraction in each branch and path metric calculation, the resulting hardware reduction can be substantial. Finally, the lower chip count and resulting improved propagation delay can sometimes permit implementation using a more desirable technology offering lower cost and reduced power consumption.

What is claimed:

1. A maximum likelihood decoding method of recreating data from a sequence of received symbols representing that data, said method comprising the steps of storing in memory a trellis of a plurality of encoder states and symbols associated with a transition from each encoder state to another encoder state, whereby a plurality of paths through said trellis are each associated with a respective symbol sequence, selecting a symbol sequence and associated path through said trellis most likely represented by said sequence of received symbols, and recreating said data in accordance with said selected symbol sequence, said selecting step comprising determining a current path metric as a function of at least a previous path metric and a current branch metric, said step of determining said current path metric comprising the steps of:

attenuating said previous path metric; and adding said current branch metric to said attenuated previous path metric to obtain a sum representing said current path metric.

2. A method as claimed in claim 1, wherein said attenuating step comprises multiplying said previous path metric by a constant k, wherein k is less than 1.

3. A method as claimed in claim 2, wherein k is greater than 0.9.

4. A method as claimed in claim 1, wherein said attenuating step and said addition step are performed as a single operation.

5. A method as claimed in claim 1, wherein said current path metric is calculated by a single read-only memory addressed by said previous path metric and current branch metric.

6. A method as claimed in claim 5, wherein said single read-only memory is a programmable read-only memory.

7. A method as claimed in claim 1, further comprising the step of calculating a value of said current branch metric prior to said adding step, wherein said current branch metric calculating step comprises:

multiplying one or more received data signals by respective constants to obtain respective products, said constants depending on the modulation used to encode said received data signals; and adding said products to obtain a multiplication sum and providing said multiplication sum as the current branch metric value added in said adding step.

8. A method as claimed in claim 7, wherein said attenuation step, addition step and branch metric calculating step are performed using a single read-only memory addressed by said received data signals and previous path metric.

9. A method as claimed in claim 8, wherein said single read-only memory is a single programmable read-only memory.

10. A method as claimed in claim 1, wherein said attenuating step and said addition step are performed by a one of a programmable logic device and programmable computer.

11. A maximum likelihood decoding method of recreating data from a sequence of received symbols representing that data, said method comprising the steps of storing in memory a trellis of a plurality of encoder states and symbols associated with a transition from each encoder state to another encoder state, whereby a plurality of paths through said trellis are each associated with a respective symbol sequence, selecting a symbol sequence and associated path through said trellis most likely represented by said sequence of received symbols, and recreating said data in accordance with said selected symbol sequence, said selecting step comprising determining for a given encoder state a plurality of current path metrics as a function of previous path metrics and a current branch metric, each current path metric corresponding to a different path through said trellis to said given encoder state, and selecting one of said current path metrics as a state metric for said given encoder state reflecting a most likely path through said trellis to said given encoder state, said determining step comprising:

attenuating a value of a previous path metric;

adding a current branch metric to said attenuated path metric to form a current path metric;

repeating said attenuating and adding steps for each of a plurality of paths entering said given encoder state; and selecting one of said current path metrics as said state metric for said given encoder state.

12. A method as claimed in claim 11, further comprising the step of repeating said repeating step and said selecting step for each of said plurality of encoder states.

13. A maximum likelihood decoding apparatus for recreating data from a sequence of received symbols representing that data, said apparatus comprising means for storing in memory a trellis of a plurality of encoder states and symbols associated with a transition from each encoder state to another encoder state, whereby a plurality of paths through said trellis are each associated with a respective symbol sequence, means for selecting a symbol sequence and associated path through said trellis most likely represented by said sequence of received symbols, and means for recreating said data in accordance with said selected symbol sequence, said means for selecting comprising determining means for determining a current path metric as a function of at least a previous path metric and a current branch metric, said determining means comprising:

means for attenuating said previous path metric; and means for adding said current branch metric to said attenuated path metric to form said current path metric.

14. An apparatus as claimed in claim 13, wherein said attenuating means comprises means for multiplying said previous path metric by a constant k wherein k is less than 1.

15. An apparatus as claimed in claim 14, wherein k is greater than 0.9.

16. An apparatus as claimed in claim 14, wherein said means for attenuating and said means for adding together comprise a single read-only memory addressed by said previous path metric and current branch metric.

17. An apparatus as claimed in claim 16, wherein said single read-only memory is a programmable read-only memory.

18. An apparatus as claimed in claim 14, further comprising calculating means for calculating a value of said current branch metric, said calculating means comprising:

means for multiplying each of plural received encoded data signals by a respective constant to obtain multiplication products, said constants depending on the modulation used to encode said received data signals; and means for adding said multiplication products to obtain a multiplication sum and for providing said multiplication sum as the current branch metric value added by said adding means.

19. An apparatus as claimed in claim 18, wherein said received data signals are soft-detected.

20. An apparatus as claimed in claim 18, wherein said attenuating, adding and calculating means comprise a single read-only memory addressed by said previous path metric and said received data signals.

21. An apparatus as claimed in claim 20, wherein said single read-only memory is a programmable read-only memory.

22. A maximum likelihood decoding apparatus for recreating data from a sequence of received symbols representing that data, said apparatus comprising means for storing in memory a trellis of a plurality of encoder states and symbols associated with a transition from each encoder state to another encoder state, whereby a plurality of paths through said trellis are each associated with a respective symbol sequence, and means for selecting a symbol sequence and associated path through said trellis most likely represented by said sequence of received symbols, and means for recreating said data in accordance with said selected symbol sequence, said means for selecting comprising determining means for determining for a given encoder state a plurality of current path metrics as a function of previous path metrics and a current branch metric, each current path metric corresponding to a different path through said trellis to said given encoder state, and for selecting one of said current path metrics as a state metric for said given encoder state reflecting a most likely path through said trellis to said given encoder state, said determining means comprising:

means for attenuating values of previous path metrics;

means for adding a current branch metric to said attenuated path metrics to form current path metric for each of a plurality of paths entering said given encoder state; and means for selecting one of said current path metrics as said state metric for said given encoder state.

23. An apparatus as claimed in claim 22, further comprising means for selecting a state metric for each of said plurality of states.

* * * * *